US007615415B2

(12) United States Patent
Kwon et al.

(10) Patent No.: US 7,615,415 B2
(45) Date of Patent: Nov. 10, 2009

(54) VERTICAL STACK TYPE MULTI-CHIP PACKAGE HAVING IMPROVED GROUNDING PERFORMANCE AND LOWER SEMICONDUCTOR CHIP RELIABILITY

(75) Inventors: Heung-kyu Kwon, Seongnam-si (KR); Tae-hun Kim, Cheonan-si (KR); Su-chang Lee, Gangdong-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/781,377

(22) Filed: Jul. 23, 2007

(65) Prior Publication Data
US 2008/0029869 A1    Feb. 7, 2008

(30) Foreign Application Priority Data
Aug. 1, 2006    (KR) ............... 10-2006-0072661

(51) Int. Cl.
*H01L 21/00* (2006.01)
(52) U.S. Cl. .................. 438/125; 438/126; 438/127
(58) Field of Classification Search ............. 257/777, 257/686, 723
See application file for complete search history.

(56) References Cited
U.S. PATENT DOCUMENTS

| | | | |
|---|---|---|---|
| 6,316,840 B1 * | 11/2001 | Otani | 257/787 |
| 6,737,750 B1 * | 5/2004 | Hoffman et al. | 257/777 |
| 6,861,288 B2 | 3/2005 | Shim et al. | |
| 7,049,691 B2 * | 5/2006 | Karnezos | 257/686 |
| 2004/0183180 A1 | 9/2004 | Chung et al. | |

* cited by examiner

*Primary Examiner*—Zandra Smith
*Assistant Examiner*—Paul E Patton
(74) *Attorney, Agent, or Firm*—Volentine & Whitt, PLLC

(57) ABSTRACT

A vertical stack type multi-chip package is provided having improved reliability by increasing the grounding performance and preventing the decrease in reliability of the multi-chip package from moisture penetration into a lower semiconductor chip. The vertical stack type multi-chip package comprises an organic substrate having a printed circuit pattern on which a semiconductor chip is mounted. A first semiconductor chip is mounted on a die bonding region of the organic substrate and is electrically connected to the organic substrate through a first wire. A metal stiffener is formed on the first semiconductor chip and connected to the organic substrate by a first ground unit around the first semiconductor chip. An encapsulant is used to seal the first semiconductor chip below the metal stiffener. A second semiconductor chip, which is larger in size than that the first semiconductor chip, is mounted on the metal stiffener and connected by a second ground unit. The second semiconductor chip is connected to the organic substrate by a second wire. A mold resin seals the second semiconductor chip and a solder ball is bonded to a solder ball pad below the organic substrate.

15 Claims, 3 Drawing Sheets

VERTICAL STACK TYPE MULTI-CHIP PACKAGE HAVING IMPROVED GROUNDING PERFORMANCE AND LOWER SEMICONDUCTOR CHIP RELIABILITY

BACKGROUND OF THE INVENTION

1. Field of the Invention

The present invention relates to a vertical stack type multi-semiconductor package and an associated method of fabrication. More particularly, embodiments of the invention relate to a vertical stack type multi-chip package having improved grounding performance of a system in package (SIP) configuration and improved reliability generated in a lower first semiconductor chip.

This U.S non-provisional patent application claims priority under 35 U.S.C § 119 of Korean Patent Application 10-2006-0072661 filed on Aug. 1, 2006, the entire contents of which are hereby incorporated by reference.

2. Discussion of Related Art

There is a high demand for portable electronic products. Semiconductor devices used in such portable electronic products must be light, thin, short and small. These devices may be developed by reducing the size of a discrete semiconductor device, forming a system on chip (SOC) by placing several semiconductor devices in one semiconductor chip to make one chip, and forming a system in package (SIP) by packaging a plurality of semiconductor devices in one semiconductor package.

SIP technology involves packaging a plurality of semiconductor chips into a single semiconductor package by horizontally or vertically stacking the semiconductor chips on a lead frame or a substrate. This technology is similar to the concept applied in existing multi-chip module (MCM) technology. That is, existing MCM technology involves mounting semiconductor chips horizontally where SIP technology involves vertically stacking the semiconductor chips.

Certain semiconductor devices, for example, for radio frequency (RF) applications, are influenced by an external electromagnetic field. Furthermore, low impedance and low inductance are required due to the characteristics particular to RF semiconductor devices. Therefore, a ground shielding design from the external environment is employed in order to satisfy the requirements of low impedance and low inductance. Thus, a semiconductor package that is resistive to noise can be fabricated by enhancing the grounding performance of the SIP including the semiconductor device for RF applications.

An example of providing a semiconductor package by enforcing the grounding performance in SIP technology is disclosed in US Application Publication No. 2004/0183180 A1 (Publication Date: Sep. 23, 2004, Title: Multi-Chips stacked package) by Advanced Semiconductor Engineering Inc. However, since a lower semiconductor package is sealed by a cap-shaped supporter and the inner portion of the lower semiconductor package is filled with air, moisture penetrates into the sealed portion through the organic substrate which causes a decrease in the reliability of the semiconductor device.

SUMMARY OF THE INVENTION

Exemplary embodiments of the present invention are directed to a vertical stack type multi-chip package and method of fabrication. The vertical stack type multi-chip package provides improved grounding performance and improved lower semiconductor chip reliability. The multi-chip package may include an organic substrate having a printed circuit pattern and a die bonding region. A first semiconductor chip is mounted on the die bonding region and electrically connected to the organic substrate via a first wire. An encapsulant is used for sealing the first semiconductor chip. A metal stiffener is formed on the first semiconductor chip above the encapsulant and connects to the organic substrate by a first ground unit around the first semiconductor chip. A second semiconductor chip, larger in size as compared to the first semiconductor chip, is mounted on the metal stiffener connected by a second ground unit and connected to the organic substrate by a second wire. A mold resin is used for sealing the second semiconductor chip connected to the organic substrate. A solder ball is bonded to a solder ball pad below the organic substrate.

DESCRIPTION OF EMBODIMENTS

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. For example, an organic substrate has been used as a main frame of a semiconductor package in the embodiment of the present invention, but the main frame may be replaced with a conventional main frame for a semiconductor package such as a lead frame.

Figure 1:
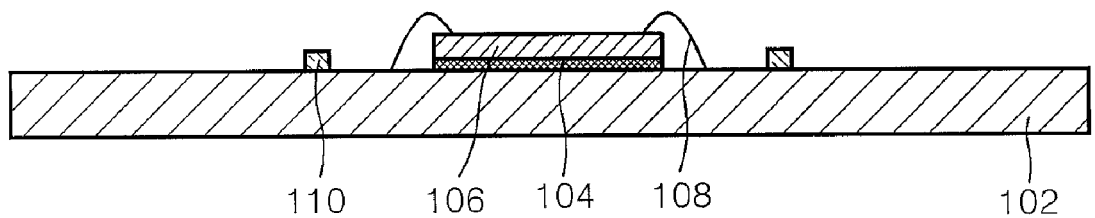
FIG. 1 is a sectional view illustrating a first semiconductor chip mounted on an organic substrate according to an embodiment of the present invention.

FIG. 1 is a sectional view illustrating a semiconductor chip 106 mounted on an organic substrate 102 using a die bonding material 104. Semiconductor chip 106 may be a device used for radio frequency (RF) applications, which is relatively small in size. Die bonding material 104 may be, for example, a conductive epoxy, nonconductive epoxy, bonding tape and like materials. Organic substrate 102 may be a rigid substrate using bismaleimide-triazine (BT) resin, FR4 resin, or a flexible substrate using polyimide resin. The organic substrate 102 has the advantages of incurring low costs and easy processing, but has a drawback in that it is vulnerable to exterior moisture.

Organic substrate 102 has a top and bottom surface. A die bonding region (not shown) is located at the center of one of the surfaces of the organic substrate 102 where a semiconductor chip is mounted, a bond finger for wire bonding, and a printed circuit pattern connecting the bond finger and a solder ball pad (not shown) formed on the other surface of the organic substrate 102.

Figure 2:
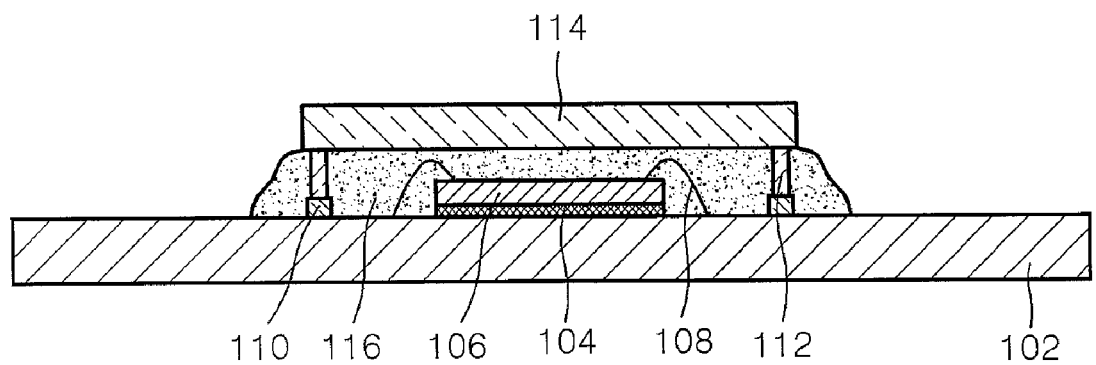
FIG. 2 is a sectional view illustrating a metal stiffener formed on an organic substrate having a first semiconductor chip mounted on the organic substrate, and an encapsulant formed on the organic substrate, according to an embodiment of the present invention.

A solder bump 110 may be formed on the printed circuit pattern which may be connected to a metal stiffener plate 114 shown in FIG. 2. Solder bump 110 is preferably surface-treated using one of Cu, Ni, Au, solder and an organic solderability preservative (OSP), or mixtures of the foregoing. Alternatively, solder bump 110 may be formed by a separate solder bump formation process before connecting solder bump 110 to the metal stiffener plate 114 instead of using the organic substrate 102 as shown in FIG. 1.

When die bonding material 104 is conductive, it is preferable to expose the printed circuit pattern to ground organic substrate 102 to the outside, so that a backside of first semiconductor chip 106 is grounded to organic substrate 102. In this manner, the effects of noise occurring during operation of the semiconductor package can be minimized by improving the grounding performance of chip 106. A wire bonding process is performed to connect the bond pad of the first semiconductor chip 106 and the bond finger of the organic substrate 102 using a first wire 108.

FIG. 2 is a sectional view illustrating an encapsulant 116 disposed on organic substrate 102 having first semiconductor chip 106 mounted thereon. A metal stiffener plate 114 is formed over first semiconductor chip 106, that is, outside of the first semiconductor chip 106 to cover the first semiconductor chip 106, through first ground units 112. Encapsulant 116 is disposed between stiffener plate 114 and chip 106. First ground units 112 are conductive posts that act as a ground and connect metal stiffener plate 114 to a metal circuit pattern disposed on organic substrate 102. First ground units 112 are connected to solder bump 110 disposed on the organic substrate 102 and are connected to the metal circuit pattern for ground purposes disposed on organic substrate 102.

A surface treatment may be performed on the bottom surface of first ground units 112 that connects to solder bump 110. Metal stiffener plate 114 may be comprised of a metal having a high thermal conductivity such as copper but preferably copper of alloy 42, which is widely used as a main material for a lead frame, and a high electrical conductivity. Furthermore, the top surface of the metal stiffener plate 114 is preferably surface-treated by, for example, an Ag plating treatment for wire bonding. When heat capable of melting the solder in solder bump 110 is applied during the process of connecting the metal stiffener plate 114 to organic substrate 102, first ground units 112 and solder bump 110 are connected and encapsulant 116 is hardened. This avoids an additional process step for hardening encapsulant 116. Encapsulant 116 has a lower modulus value than that of an epoxy mold compound (EMC), which is used as a conventional mold resin of a semiconductor device. Since encapsulant 116 has a low modulus value, it seals first semiconductor chip 106 and first wire 108. Thus, after fabrication of a stack type multi-chip SIP package is complete, the reliability of first semiconductor chip 106 may be improved by filling the lower portion of metal stiffener plate 114 with nonconductive encapsulant 116, thereby preventing a decrease in reliability of the structure due to moisture penetration through organic substrate 102.

Figure 3:
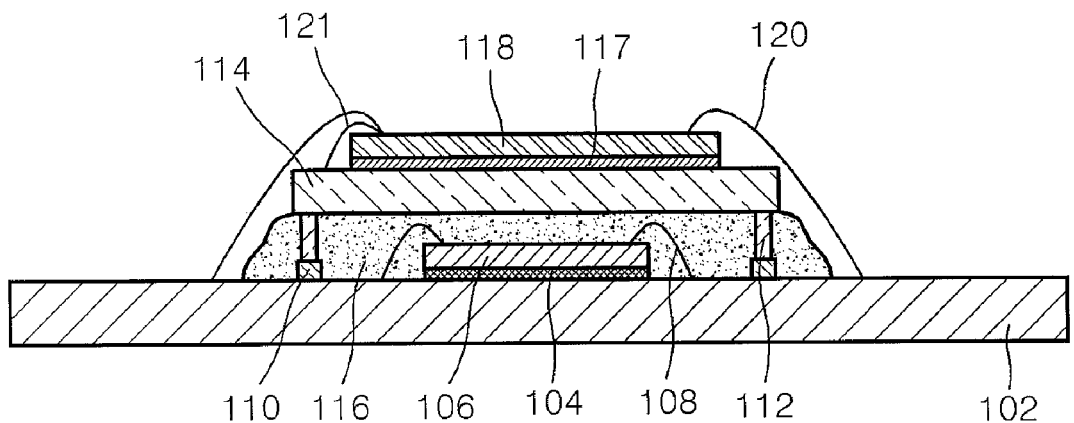
FIG. 3 is a sectional view illustrating a second semiconductor chip mounted on an organic substrate having a metal stiffener formed on the organic substrate, according to an embodiment of the present invention.

FIG. 3 is a sectional view illustrating a second semiconductor chip 118 mounted on organic substrate 102 via metal stiffener plate 114 using a nonconductive die bonding material 117. Second semiconductor chip 118 may be, for example, a semiconductor chip for a base band telecommunication system which is preferably larger in size as compared to first semiconductor chip 106. A wire bonding process for electrically connecting a bond pad of second semiconductor chip 118 to a bond finger disposed on organic substrate 102 using a second wire 120 is performed. In addition, a wire bonding process is also performed for directly connecting second semiconductor chip 118 to metal stiffener plate 114 using ground 121 in the form of second wire 120. In this manner, second semiconductor chip 118 also comprises a ground path in the form of the second wire 120, the metal stiffener plate 114, the first ground units 112, and the solder bump 110. Thus, the grounding performance of the second semiconductor chip 118 in a stack type multi-chip package is improved.

Since second semiconductor chip 118 is larger than and stacked on smaller sized first semiconductor chip 106 and the wire bonding is performed on the boundary of the second semiconductor chip 118, the wire bonding is not appropriate since any member supporting the boundary of second semiconductor chip 118 cannot exist below the boundary of the second semiconductor chip 118. However, the metal stiffener plate 114 is employed to solve this overhang problem since metal stiffener plate 114 firmly supports the lower portion of second semiconductor chip 118.

Figure 4:
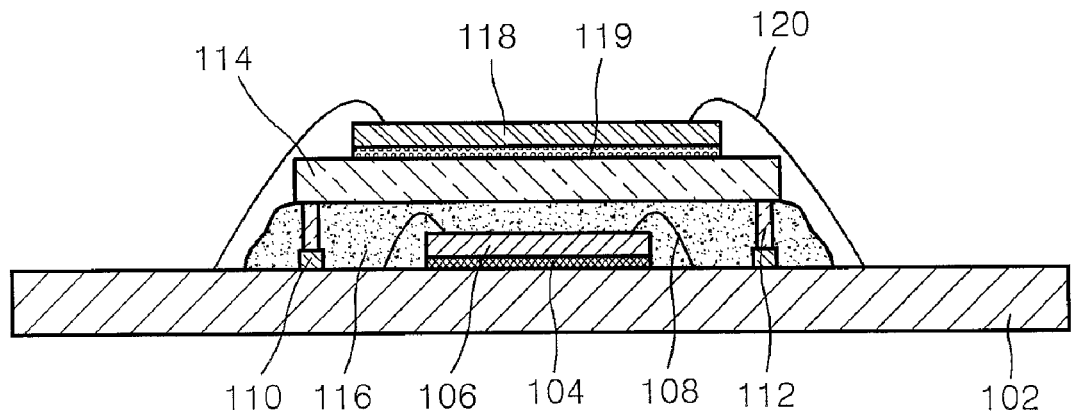
FIG. 4 is a sectional view illustrating a modified example of FIG. 3, in which a conductive die bonding material is used as a second ground unit, according to an embodiment of the present invention.

FIG. 4 is a side view illustrating a modified embodiment of that shown with reference to FIG. 3. Second semiconductor chip 118 is grounded to metal stiffener plate 114 using ground 121 in the form of second wire 120 as the second ground unit, but uses conductive die bonding material 119 for mounting second semiconductor chip 118. Conductive die bonding material 119 acts as a second ground unit. Thus, a ground path is defined which directly connects metal stiffener plate 114, first ground units 112, solder bump 110, and organic substrate 102 through the lower surface of second semiconductor chip 118 on which conductive die bonding material 119 is disposed. This improves the grounding performance of second semiconductor chip 118 in view of the aforementioned overhang problem.

Figure 5:
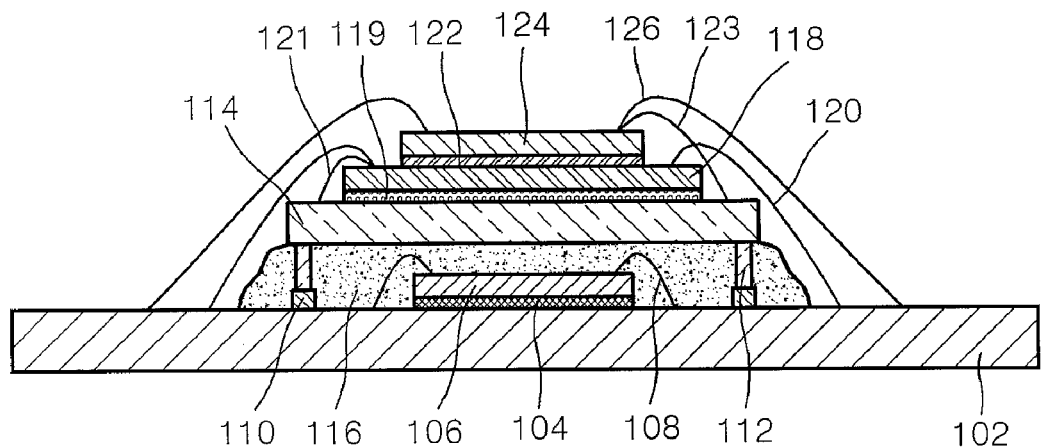
FIG. 5 is a sectional view illustrating a third semiconductor chip mounted on an organic substrate having a second semiconductor chip mounted on the organic substrate, according to an embodiment of the present invention.

FIG. 5 is a side view illustrating a third semiconductor chip 124 mounted on second semiconductor chip 118 using a nonconductive die bonding material 122. Third semiconductor chip 124 may be, for example, a semiconductor chip of a NOR memory. A wire bonding process for connecting a bond pad of the third semiconductor chip 124 to a bond finger of organic substrate 102 using a third wire 126 is performed. If necessary, a wire bonding process for directly connecting third semiconductor chip 124 to metal stiffener plate 114 using a third wire that acts as a ground 123 may also be performed in order to improve the grounding performance of third semiconductor chip 124.

Figure 6:
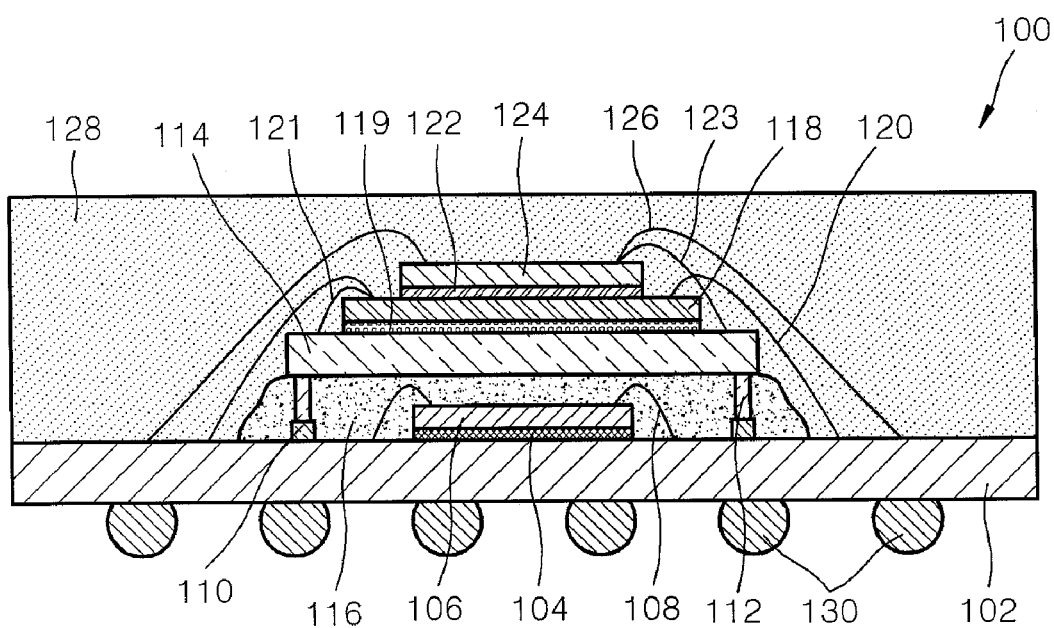
FIG. 6 is a sectional view illustrating a process of bonding a molding and a solder ball on an organic substrate having the third semiconductor chip mounted on the organic substrate, according to an embodiment of the present invention.

FIG. 6 is a sectional view illustrating of the sealing of organic substrate 102 having third semiconductor chip 124 mounted on organic substrate 102 using a mold resin 128. Mold resin 128 may be, for example, an EMC performed by a conventional method. The process of bonding solder ball 130 to a solder ball pad (not shown) disposed below organic substrate 102 is performed by a conventional method.

Finally, a process is performed to separate a plurality of stack type multi-chip packages 100 arranged in a matrix shape and fabricated together. The stack type multi-chip package 100 according to an embodiment of the present invention essentially comprises organic substrate 102 on which a semiconductor chip is mounted. A first semiconductor chip 106 is mounted on organic substrate 102 and connected to the substrate through first wire 108, metal stiffener 114 and first ground units 112 acting as a conductive post. An encapsulant 116 fills the lower portion around the first semiconductor chip below the metal stiffener 114. A second semiconductor chip 118 is grounded by metal stiffener 114 and second ground unit 121 and connected to organic substrate 102 by second wire 120 on the metal stiffener 114. A mold resin 128 seals the second semiconductor chip 118 on organic substrate 102 and solder ball 130 bonds the bottom surface of organic substrate 102. The ground unit connecting metal stiffener plate 114 and first and second semiconductor chips 106 and 118 to the organic substrate 102 improve the grounding performance of the stack type multi-chip package.

Although the present invention has been described in connection with the embodiment of the present invention illustrated in the accompanying drawings, it is not limited thereto. It will be apparent to those skilled in the art that various substitutions, modifications, and changes may be made thereto without departing from the scope and spirit of the invention.

What is claimed is:

1. A method of fabricating a vertical stack type multi-chip package comprising:
    mounting a first semiconductor chip on an organic substrate;
    performing a first wire bonding to connect a circuit pattern on the organic substrate with the first semiconductor chip using a first bonding wire;
    disposing a nonconductive encapsulant on the organic substrate to cover the first semiconductor chip and the first bonding wire;
    positioning a metal stiffener over the organic substrate, wherein the metal stiffener comprises a conductive post extending through the nonconductive encapsulant and contacting a solder bump disposed on the organic substrate and electrically connected to ground;
    applying heat to the metal stiffener to electrically connect the conductive post with the solder bump, and simultaneously harden the nonconductive encapsulant;
    after the conductive post is electrically connected to the solder bump and the nonconductive encapsulant is hardened, mounting a second semiconductor chip on the metal stiffener;
    sealing the first semiconductor chip, the metal stiffener, the second semiconductor chip, and the nonconductive encapsulant using a mold resin.

2. The method as recited in claim 1, further comprising:
    after mounting the second semiconductor chip on the metal stiffener, mounting a third semiconductor chip on the second semiconductor chip.

3. The method as recited in claim 1, wherein mounting the second semiconductor chip on the metal stiffener comprises using a conductive die bonding material between the second semiconductor chip and the metal stiffener.

4. The method as recited in claim 1, further comprising:
    performing a second wire bonding to connect the second semiconductor chip and the metal stiffener using a second bonding wire.

5. The method as recited in claim 1, wherein the organic substrate is composed of one material selected from an organic material group consisting of bismaleimide-triazine (BT) resin, FR4 resin, and polyimide resin.

6. The method as recited in claim 1, wherein the circuit pattern comprises a solder bump connecting the metal stiffener to the organic substrate.

7. The method as recited in claim 6, wherein the solder bump comprises a material formed on a surface of the solder bump selected from a surface treatment material group consisting of Cu, Ni, Au, solder and an organic solderability preservative (OSP).

8. The method as recited in claim 1, wherein the mounting first semiconductor chip on the organic substrate is performed using a nonconductive die bonding material.

9. The method as recited in claim 1, wherein the mounting first semiconductor chip on the organic substrate is performed using a conductive die bonding material.

10. The method as recited in claim 1, wherein the first semiconductor chip is used for RF applications.

11. The method as recited in claim 1, wherein positioning the metal stiffener comprises surface-treating a lower surface of the conductive post for solder bonding.

12. The method as recited in claim 1, wherein positioning the metal stiffener comprises surface-treating a top surface of the conductive post for wire bonding.

13. The method as recited in claim 3, wherein the conductive die bonding material grounds the second semiconductor chip to the metal stiffener.

14. The method as recited in claim 1, wherein the second semiconductor chip is used for a base band telecommunication system.

15. The method as recited in claim 2, wherein the third semiconductor chip is used for NOR memory.

* * * * *